(12) United States Patent
Shin

(10) Patent No.: US 7,084,039 B2
(45) Date of Patent: Aug. 1, 2006

(54) METHOD OF FABRICATING MOS TRANSISTOR

(75) Inventor: Hyun Soo Shin, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/024,792

(22) Filed: Dec. 30, 2004

(65) Prior Publication Data

US 2005/0142735 A1   Jun. 30, 2005

(30) Foreign Application Priority Data

Dec. 30, 2003   (KR) .................. 10-2003-0100529

(51) Int. Cl.
*H01L 21/331* (2006.01)
(52) U.S. Cl. .................. 438/303; 438/305; 438/307
(58) Field of Classification Search ......... 438/299–308
See application file for complete search history.

(56) References Cited

U.S. PATENT DOCUMENTS

| 6,144,071 A * | 11/2000 | Gardner et al. ............. 257/344 |
| 6,258,680 B1 * | 7/2001 | Fulford et al. .............. 438/305 |
| 6,534,388 B1 * | 3/2003 | Lin et al. .................... 438/510 |

* cited by examiner

*Primary Examiner*—H. Jey Tsai
(74) *Attorney, Agent, or Firm*—Oblon, Spivak, McClelland, Maier & Neustadt, P.C.

(57) ABSTRACT

A method of fabricating a CMOS (complementary metal oxide semiconductor) transistor includes manufacturing steps, by which adverse transistor characteristics can be prevented from being degraded by high-temperature annealing for hardening a screen oxide layer. The method includes steps of forming a gate on a semiconductor substrate with a gate oxide layer therebetween, forming a screen oxide layer on the substrate and the gate, forming a nitride layer on the screen oxide layer, forming LDD regions in the substrate substantially aligned with the gate, removing the nitride layer, forming a spacer on the screen oxide layer and on at least a portion of a sidewall of the gate, and forming in the substrate source/drain regions extending from the LDD regions respectively in the substrate substantially aligned with the spacer.

8 Claims, 5 Drawing Sheets

METHOD OF FABRICATING MOS TRANSISTOR

BACKGROUND OF THE INVENTION

1. Field of the Invention

The present invention relates to a method of fabricating a transistor in a semiconductor substrate, and more particularly, to a method of fabricating a CMOS (complementary metal oxide semiconductor) transistor.

2. Discussion of the Related Art

Generally, a transistor, such as a metal oxide semiconductor (MOS) transistor, which is constructed with a gate electrode, a source, and a drain, is essential to operating a semiconductor device.

FIG. 1 is a flowchart of a method of fabricating a CMOS transistor according to a related art.

Referring to FIG. 1, a device isolation layer is formed on a semiconductor substrate to define an active area and a field area (S1). The device isolation layer is called a field oxide layer and is formed by LOCOS (local oxidation of silicon) or STI (shallow trench isolation).

A well is formed in the substrate for forming a CMOS transistor therein (S2). An n-well is formed for a PMOS transistor and a p-well is formed for an NMOS transistor.

A gate oxide layer and a polysilicon layer are formed on the substrate in turn to form a gate electrode.

The polysilicon layer is etched to form a polysilicon gate using a mask pattern (S3).

In etching the polysilicon layer using a gate mask pattern, the gate oxide layer is degraded. In order to compensate for the degradation of the gate oxide layer and to protect the substrate against LDD (lightly doped drain) ion implantation, gate sidewall oxidation, i.e., re-oxidation is carried out to form a screen oxide layer on an exposed surface of the substrate and a sidewall of the gate. In doing so, the screen oxide layer is formed to be 15~30 Å thick.

Subsequently, oxidation annealing is carried out for hardening the screen oxide layer (S4). In doing so, annealing is performed at 1,000° C. (or higher) for 10 seconds in an atmosphere of $N_2$ gas.

In order to prevent hot carriers from being generated from a drain edge of an NMOS transistor by a high electric field for example, ion implantation is carried out on the substrate to form LDD regions aligned with the gate (S5).

Subsequently, a spacer is formed on a sidewall of the polysilicon gate (S6). In doing so, the spacer has an N—O—N structure including a spacer nitride layer/buffer oxide layer/sealing nitride layer.

And, source/drain regions extending from the LDD are formed by ion implantation to be aligned with the spacer in the substrate (S7).

Finally, silicidation is carried out on the substrate to lower contact resistance of the source/drain regions to complete the fabrication of the transistor (S8).

As mentioned in the foregoing explanation, the screen oxide layer is formed by sidewall oxidation of the polysilicon gate to serve as a screen against LDD ion implantation and to suppress leakage current.

SUMMARY OF THE INVENTION

However, as recognized by the present inventor, annealing is performed at high temperature to harden the screen oxide layer after the sidewall oxidation. However, the well and the channel area under the polysilicon gate are adversely affected because the voltage threshold characteristics of the transistor are degraded, as well as other effects.

Accordingly, the present invention is directed to a method of fabricating a CMOS (complementary metal oxide semiconductor) transistor that substantially obviates one or more of the above-identified and other problems due to limitations and disadvantages of the related art.

An object of the present invention is to provide a method of fabricating a CMOS (complementary metal oxide semiconductor) transistor, by which transistor characteristics can be prevented from being degraded by high-temperature annealing for hardening a screen oxide layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages in accordance with the purpose of the invention, as embodied and broadly described herein, a method of fabricating a CMOS transistor according to the present invention includes the steps of forming a gate on a semiconductor substrate to have a gate oxide layer in-between, forming a screen oxide layer on the substrate including the gate, forming a nitride layer on the screen oxide layer, forming LDD regions in the substrate to be aligned with the gate, forming a spacer on the screen oxide layer on a sidewall of the gate, removing the nitride layer for areas left exposed and not covered by the sidewall, and forming source/drain regions extending from the LDD regions respectively in the substrate to be aligned with the spacer.

Preferably, the screen oxide layer needs no annealing to be hardened.

Preferably, the nitride layer is formed 5~20 Å thick.

Preferably, the nitride layer is formed by either remote plasma nitridation or low pressure chemical vapor deposition.

Preferably, the gate includes at least one material selected from the group consisting of polysilicon, tungsten, tungsten nitride, tungsten silicide, TiN, and Ti layers.

Preferably, the method further includes the step of forming a silicide layer on the source/drain regions.

In the present invention, a nitride layer is formed on a surface of a screen oxide layer formed by sidewall oxidation instead of performing annealing on the screen oxide layer. Hence, both the screen oxide layer and the nitride layer serve as a screen against ion implantation to prevent damage to the surface of the silicon. A thermal budget can be lowered relative to a conventional process because the use of nitride avoids the need to use high-temperature annealing. The thermal voltage refers to a transistor characteristic curve of voltage threshold vs. poly length, where the voltage threshold is undesirably lowered when the device is exposed to higher temperatures during manufacture.

It is to be understood that both the foregoing general description and the following detailed description of the present invention are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
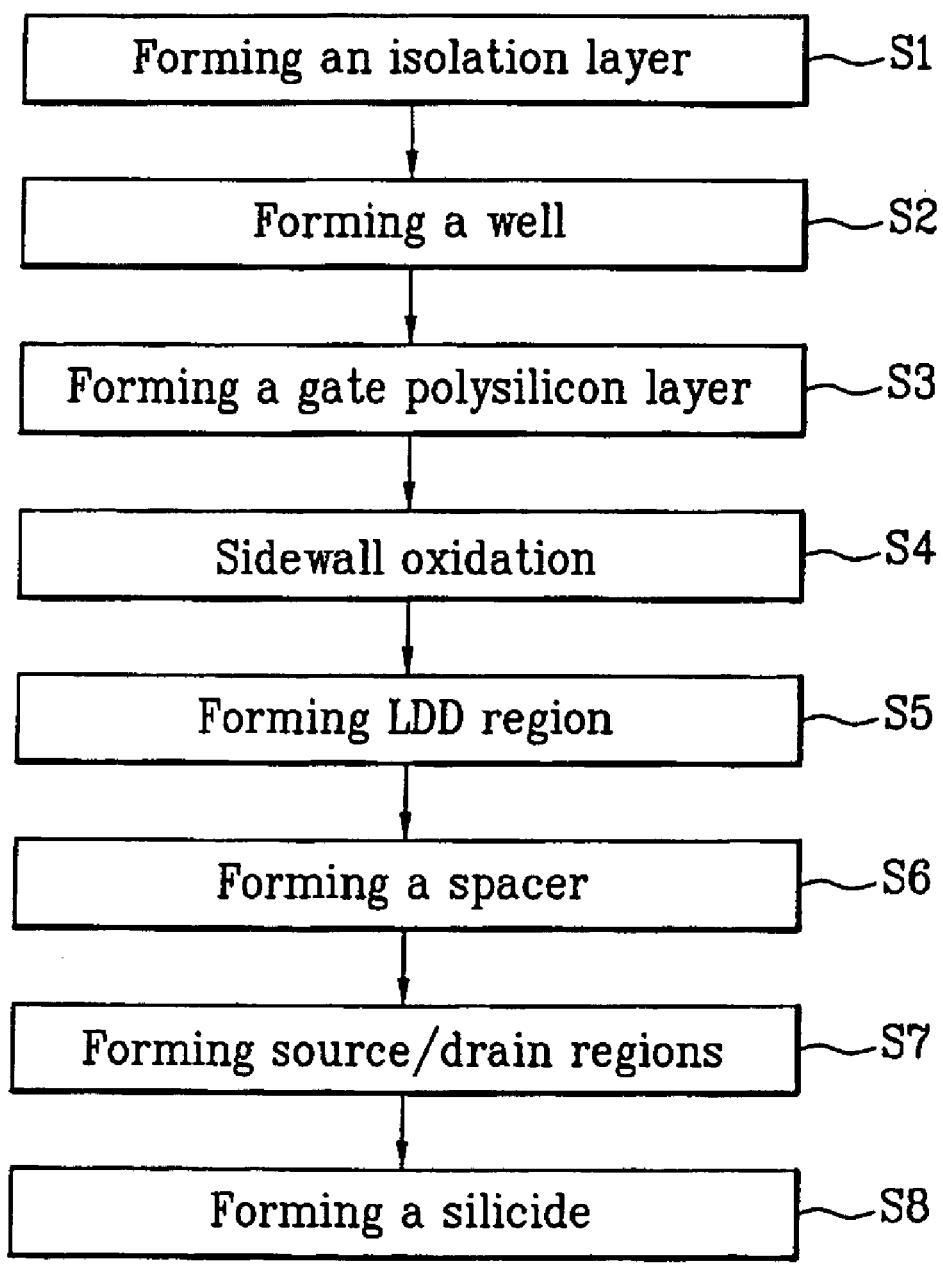
FIG. 1 is a flowchart of a method of fabricating a CMOS transistor according to the related art.
Figure 2:
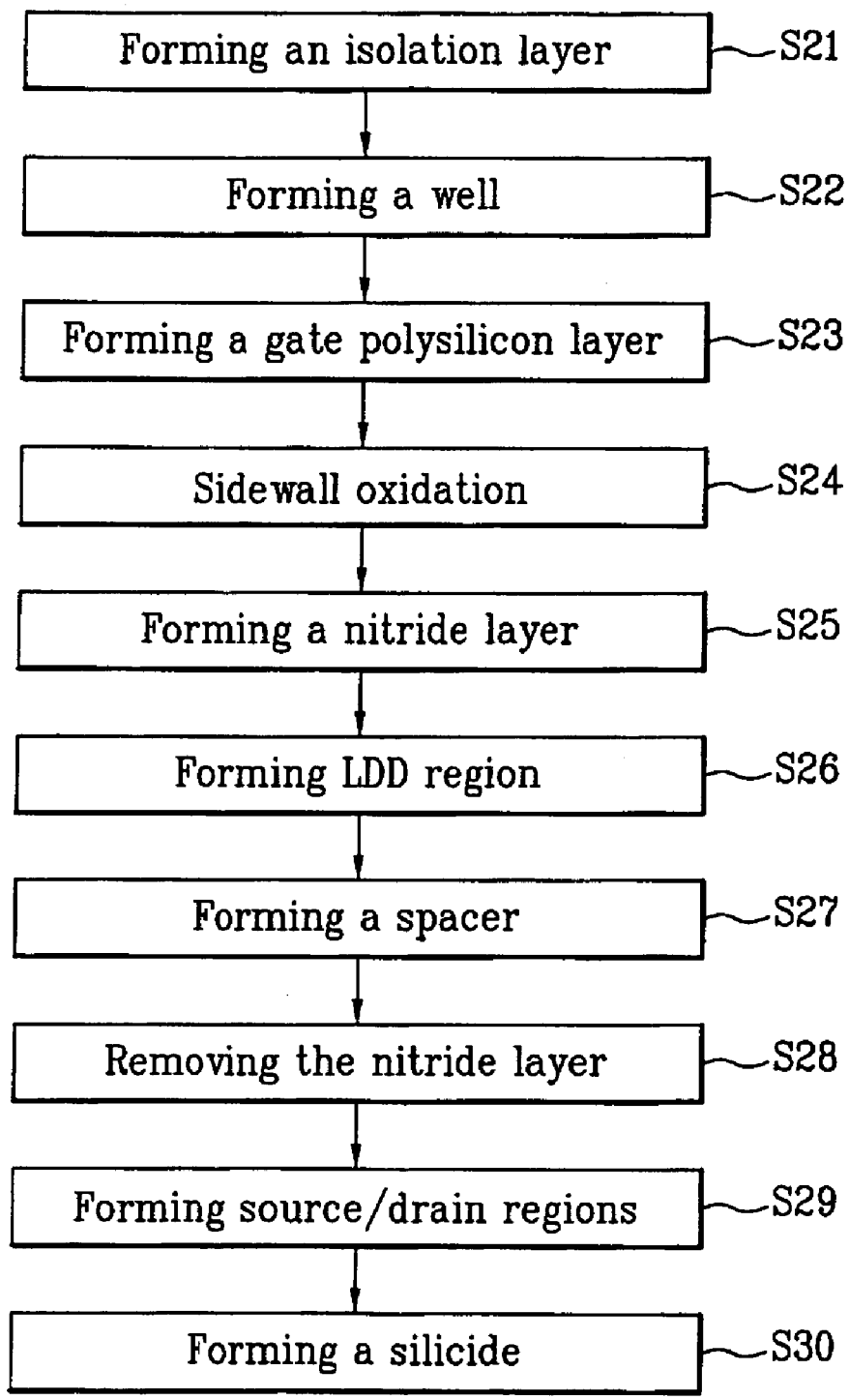
FIG. 2 is a flowchart of a method of fabricating a CMOS transistor according to the present invention.

FIG. 2 is a flowchart of a method of fabricating a CMOS transistor according to the present invention.

Referring to FIG. 2, a device isolation layer is formed on a semiconductor substrate to define an active area and a field area (S21). The device isolation layer is called a field oxide layer and is formed by LOCOS (local oxidation of silicon) or STI (shallow trench isolation).

A well is formed in the substrate for forming a CMOS transistor therein (S22). An n-well is formed for a PMOS transistor and a p-well is formed for an NMOS transistor.

A gate oxide layer and a polysilicon layer are formed on the substrate in turn to form a gate electrode.

The polysilicon layer is etched to form a polysilicon gate using a mask pattern (S23).

In etching the polysilicon layer using a gate mask pattern, the gate oxide layer is degraded. In order to compensate for the degradation of the gate oxide layer and to protect the substrate against damage due to LDD (lightly doped drain) ion implantation, gate sidewall oxidation, e.g., re-oxidation is carried out to form a screen oxide layer on an exposed surface of the substrate and a sidewall of the gate (S24).

Moreover, instead of performing annealing for hardening the screen oxide layer, a nitride layer is formed on the screen oxide layer to serve as a screen against ion implantation as well (S25). In doing so, the nitride layer is formed 5~20 Å thick by remote plasma nitridation or LPCVD (low pressure chemical vapor deposition).

In order to prevent hot carriers from being generated from a drain edge of an NMOS transistor by a high electric field for example, ion implantation is carried out on the substrate to form LDD regions aligned with the gate (S26).

Subsequently, a spacer is formed on a sidewall of the polysilicon gate (S27). In doing so, the spacer has an N—O—N structure including a spacer nitride layer/buffer oxide layer/sealing nitride layer.

And, the screen oxide layer and the nitride layer on the polysilicon gate are removed (S28), but the sidewall portion and screen portion remain.

And, source/drain regions extending from the LDD are formed by ion implantation to be aligned with the spacer in the substrate (S29).

Finally, silicidation is carried out on the substrate to lower contact resistance of the source/drain regions to complete the fabrication of the transistor (S30).

A method of fabricating a CMOS transistor according to one embodiment of the present invention is explained as follows.

FIGS. 3A to 3G are cross-sectional diagrams for explaining a method of fabricating a CMOS transistor according to one embodiment of the present invention.

Figure 3A:
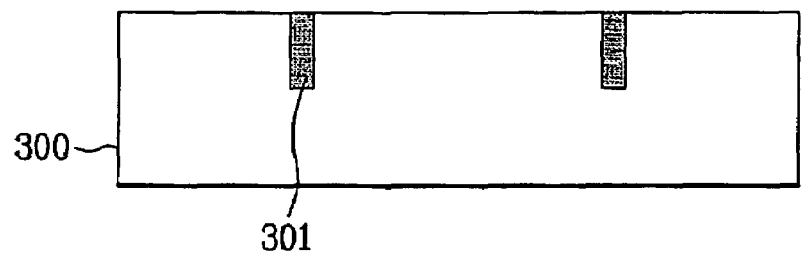
FIGS. 3A to 3G are cross-sectional diagrams for explaining a method of fabricating a CMOS transistor according to one embodiment of the present invention.

Referring to FIG. 3A, a device isolation layer 301 is formed on a semiconductor substrate 300 to define an active area and a field area. The device isolation layer 301 is called a field oxide layer and is generally formed by LOCOS (local oxidation of silicon) or STI (shallow trench isolation).

Figure 3B:
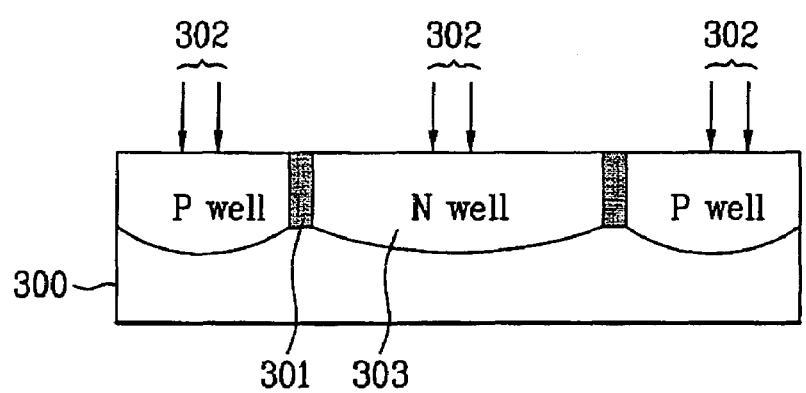

Referring to FIG. 3B, wells 303 are formed by ion implantation 302 in the substrate 300 for forming a CMOS transistor therein. An n-well is formed for a PMOS transistor and a p-well is formed for an NMOS transistor.

Figure 3C:
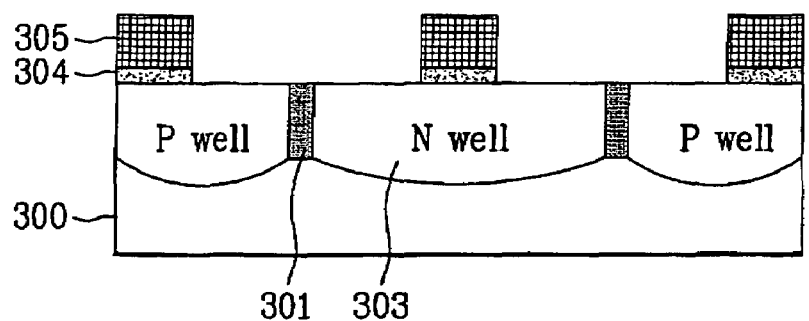

Referring to FIG. 3C, a gate oxide layer 304 and a polysilicon layer 305 are formed on the substrate 300 in turn to form a gate electrode 305.

The polysilicon layer 305 is selectively etched to form a polysilicon gate 305 using a mask pattern.

In doing so, the polysilicon layer 305 is formed in a manner of depositing undoped polysilicon and doping the undoped polysilicon by separate impurity ion implantation. Optionally, the polysilicon layer 305 can be formed by directly depositing doped polysilicon.

Figure 3D:
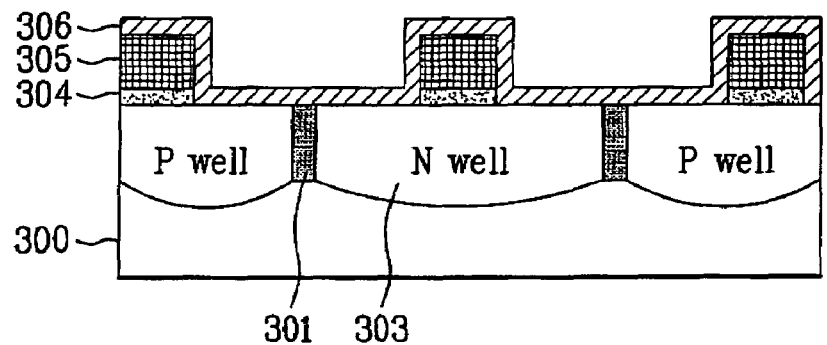

Referring to FIG. 3D, in etching the polysilicon layer 305 using a gate mask pattern, the gate oxide layer 304 is degraded. In order to compensate for the degradation of the gate oxide layer 304 and to protect the substrate against damage from LDD (lightly doped drain) ion implantation, gate sidewall oxidation, e.g., re-oxidation is carried out to form a screen oxide layer 306 on an exposed surface of the substrate and a sidewall of the gate 305.

Figure 3E:
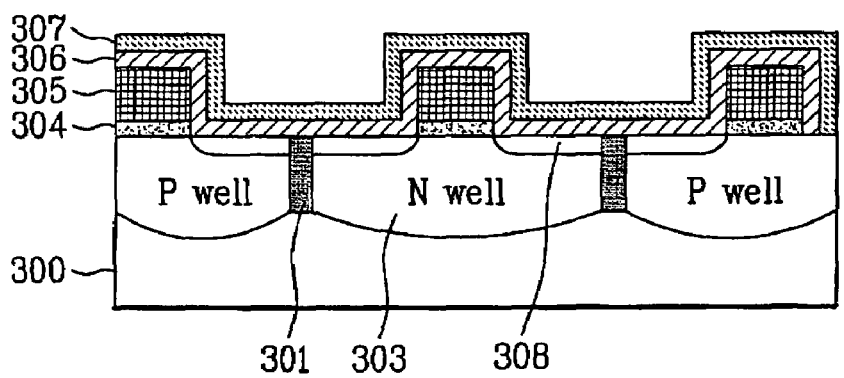

Referring to FIG. 3E, instead of performing annealing for hardening the screen oxide layer, a nitride layer 307 is formed on the screen nitride layer 306 to serve as a screen against ion implantation. In doing so, the nitride layer 307 is formed 5~20 Å (i.e., any one of 5, 6, 7, . . . 20 Å) thick by remote plasma nitridation or LPCVD (low pressure chemical vapor deposition).

Referring to FIG. 3E, in order to prevent hot carriers from being generated from a drain edge of an NMOS transistor by a high electric field for example, ion implantation is carried out on the substrate to form LDD regions 308 aligned with the gate 305.

In doing so, a lightly doped n type LDD structure is formed in the p-well of the substrate in the NMOS transistor forming area and a lightly doped p type LDD structure is formed in the n-well of the substrate in the PMOS transistor forming area.

Figure 3F:
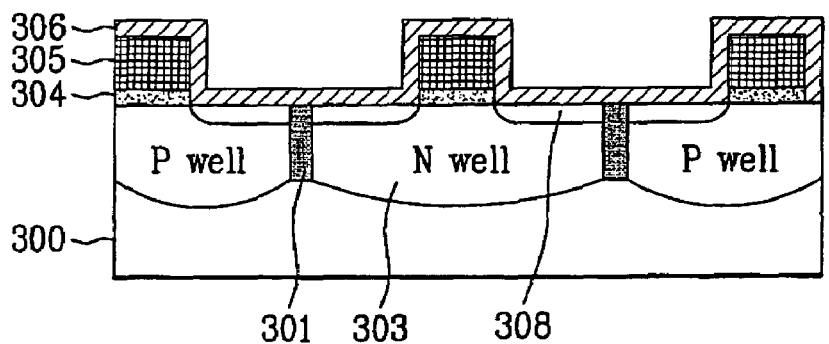

The nitride layer 307 in FIG. 3E is then removed, see FIG. 3F.

Figure 3G:
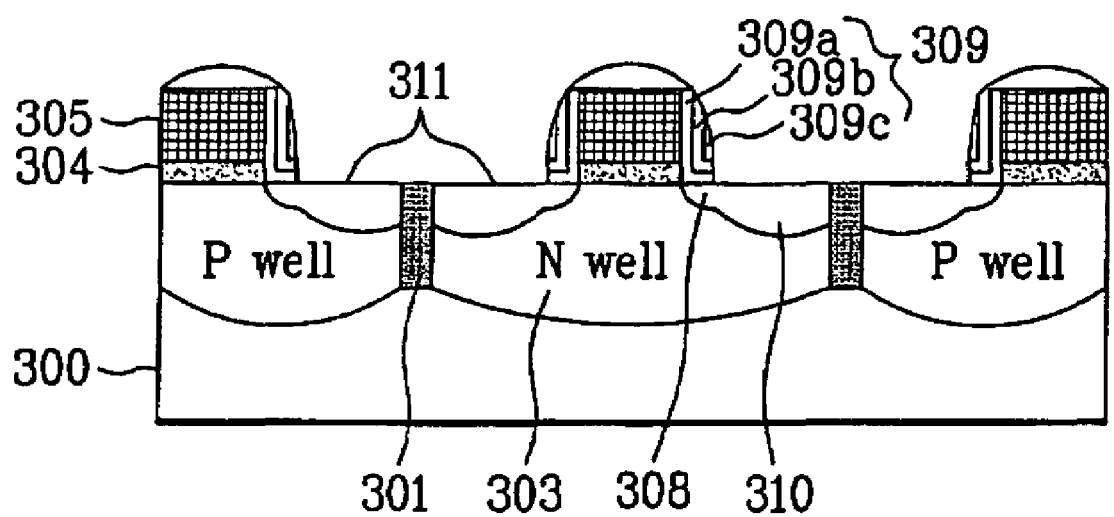

Referring to FIG. 3G, a spacer 309 is formed on a sidewall of the polysilicon gate 30. In doing so, the spacer 309 has an N—O—N structure including a spacer nitride layer/buffer oxide layer/sealing nitride layer 309c/309b/309a.

Optionally, the spacer 309 can have a dual structure of nitride/oxide.

Subsequently, source/drain regions 310 extending from the LDD regions 308 are formed by ion implantation to be aligned with the spacer 309 in the substrate.

Hence, a heavily doped n type source/drain region 310 is formed in the p-well of the substrate in the NMOS transistor forming area and a heavily doped p type source/drain region 310 is formed in the n-well of the substrate in the PMOS transistor forming area.

Finally, a silicide layer 311 is formed on the substrate by silicidation to lower contact resistance of the source/drain regions 310 to complete the fabrication of transistor.

In the above-explained structure of the present invention, the gate electrode is formed of a single polysilicon layer. Optionally, the gate electrode can employ a polycide structure of polysilicon and metal silicide. Optionally, the gate electrode can employ a structure including at least one of polysilicon, tungsten, tungsten nitride, tungsten silicide, TiN, and Ti layers.

Accordingly, in the present invention, both the screen oxide layer and the nitride layer serve as a screen against ion implantation, whereby a thermal budget due to high-temperature annealing can be lowered.

And, the present invention prevents the characteristic degradation of the wells and channels, thereby enhancing performance of the CMOS transistors.

This application contains subject matter related to that disclosed in Korean priority patent application No. P2003-0100529 filed on Dec. 30, 2003, the entire contents of which is hereby incorporated by reference.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a CMOS transistor, comprising the steps of:

forming a gate on a semiconductor substrate with a gate oxide layer therebetween;

forming a screen oxide layer on the substrate and the gate;

forming a nitride layer on the screen oxide layer; forming LDD regions in the substrate substantially aligned with the gate after forming the nitride layer;

forming a spacer on the screen oxide layer and on at least a portion of a sidewall of the gate, a sidewall portion including a oxide/nitride structure;

removing at least a portion of the nitride layer not on the sidewall;

forming in the substrate source/drain regions extending from the LDD regions respectively and substantially aligned with the spacer.

2. The method of claim 1, wherein the method does not include a step of hardening the screen oxide layer by annealing.

3. The method of claim 1, wherein the step of forming the nitride layer includes forming the nitride layer to have a thickness in an inclusive range of 5 Å. through 20 Å.

4. The method of claim 1, wherein the step of forming the nitride layer includes forming by at least one of remote plasma nitridation and low pressure chemical vapor deposition.

5. The method of claim 1, wherein the step of forming the gate comprises forming the gate with at least one material selected from the group consisting of polysilicon, tungsten, tungsten nitride, tungsten silicide, TiN, and Ti layers.

6. The method of claim 1, further comprising the step of forming a silicide layer on the source/drain regions.

7. The method of claim 1, wherein the step of forming a spacer includes forming the sidewall portion with a nitride/oxide/nitride structure.

8. A method of fabricating a CMOS transistor, comprising the steps of:

forming a gate on a semiconductor substrate with a gate oxide layer therebetween;

forming a screen oxide layer on the substrate and the gate;

forming a nitride layer on the screen oxide layer; forming LDD regions in the substrate substantially aligned with the gate after forming the nitride layer;

forming a spacer on the screen oxide layer and on at least a portion of a sidewall of the gate, a sidewall portion including a oxide/nitride structure;

removing at least a portion of the nitride layer not on the sidewall;

forming in the substrate source/drain regions extending from the LDD regions respectively and substantially aligned with the spacer.

* * * * *